(12) United States Patent
Yuan et al.

(10) Patent No.: US 7,289,530 B1
(45) Date of Patent: Oct. 30, 2007

(54) SYSTEM AND METHOD FOR CODING A DIGITAL WRAPPER FRAME

(75) Inventors: Warm Shaw Yuan, San Diego, CA (US); Daniel M. Castagnozzi, Lexington, MA (US); Alan Michael Sorgi, San Diego, CA (US); John Thomas Carr, Val Des Monts (CA)

(73) Assignee: Applied Micro Circuits Corporation, San Diego, CA (US)

( * ) Notice: Subject to any disclaimer, the term of this patent is extended or adjusted under 35 U.S.C. 154(b) by 1008 days.

(21) Appl. No.: 10/413,167

(22) Filed: Apr. 14, 2003

(51) Int. Cl.
  *H04J 3/02* (2006.01)
  *H04J 3/22* (2006.01)
  *H03M 13/00* (2006.01)

(52) U.S. Cl. ............... 370/465; 370/474; 370/538; 714/755

(58) Field of Classification Search .............. None
  See application file for complete search history.

(56) References Cited

U.S. PATENT DOCUMENTS

| | | | | |
|---|---|---|---|---|
| 5,396,504 A | * | 3/1995 | Pack | 714/755 |
| 5,400,347 A | * | 3/1995 | Lee | 714/756 |
| 5,708,665 A | * | 1/1998 | Luthi et al. | 714/704 |
| 5,742,619 A | * | 4/1998 | Hassan | 714/755 |
| 6,029,264 A | * | 2/2000 | Kobayashi et al. | 714/755 |
| 6,157,642 A | * | 12/2000 | Sturza et al. | 370/389 |
| 2006/0044162 A1 | * | 3/2006 | Fenn et al. | 341/50 |

* cited by examiner

*Primary Examiner*—Chi Pham
*Assistant Examiner*—Soon D. Hyun
(74) *Attorney, Agent, or Firm*—Law Office of Gerald Maliszewski; Gerald Maliszewski

(57) ABSTRACT

A system and method are provided for coding a frame in a packet communications system using a G.709 Digital Wrapper Frame format. The method comprises: accepting digital information; outer encoding the digital information with a Reed Solomon (RS) encoding scheme; interleaving the outer encoded information; inner encoding the interleaved information using a BCH encoding scheme; and, forming a G.709 Digital Wrapper frame including payload and parity bytes. More specifically, a standard DW superframe is formed with 122,368 bits of payload and 8192 bits of parity. The outer encoding process uses an RS(1023,1007) parent code. In one aspect, 15 groups of RS(781,765) and 1 group of RS(778,762) codewords are formed per superframe. The inner encoding process uses a BCH(2047,1959) parent code. In one aspect, 64 groups of BCH(2040,1952) codewords are formed per superframe.

28 Claims, 7 Drawing Sheets

Fig. 1a
*(PRIOR ART)*

OTUk ROW (SHOWN BEFORE INTERLEAVED TRANSMISSION)

| OH | PAYLOAD | FEC PARITY |
|----|---------|------------|
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |
| OH | PAYLOAD | FEC PARITY |

Fig. 1b
*(PRIOR ART)*

OTUk ROW (SHOWN AFTER INTERLEAVED TRANSMISSION)

| ROW \ COLUMN | 1 ··· 16 | 17 ··· 3824 | 3825 ··· 4080 |
|---|---|---|---|
| | OH | PAYLOAD | FEC PARITY |

SYSTEM AND METHOD FOR CODING A DIGITAL WRAPPER FRAME

BACKGROUND OF THE INVENTION

1. Field of the Invention

This invention generally relates to packet communications and, more particularly, to a system and method of coding a G.709 Digital Wrapper frame with inner and outer coding.

2. Description of the Related Art

Digitally wrapped, or multidimensional frame structure communications generally describe information that is sent as a packet, with overhead to control the communication process. The packet can also include forward error correction (FEC) to recover the payload if the communication is degraded. One example of such communication is the synchronous optical network (SONET). Another example is the Digital Wrapper (DW) format often used in transporting SONET communications.

There are many framed communication protocols in use, depending on the service provider and the equipment being used. These differences in protocols can be arbitrary or supported by an underlying function. Frame synchronization and overhead placement are sometimes standardized by governing organizations such as the ITU-T. At the time of this writing, the ITU-T standard for the Digital Wrapper format is G.709.

Conventionally, the interface node must include two sets of equipment. A communication in a first protocol is received at the first set of equipment (processor). The message is unwrapped and the payload recovered. Synchronization protocols must be established between the equipment set and a second set of equipment (processor). The payload can then be received at the second equipment set and repackaged for transmission in a different protocol.

FIGS. 1a and 1b are diagrams illustrating the interleaving process and the formation of an interleaved frame (prior art).

Figure 2A:
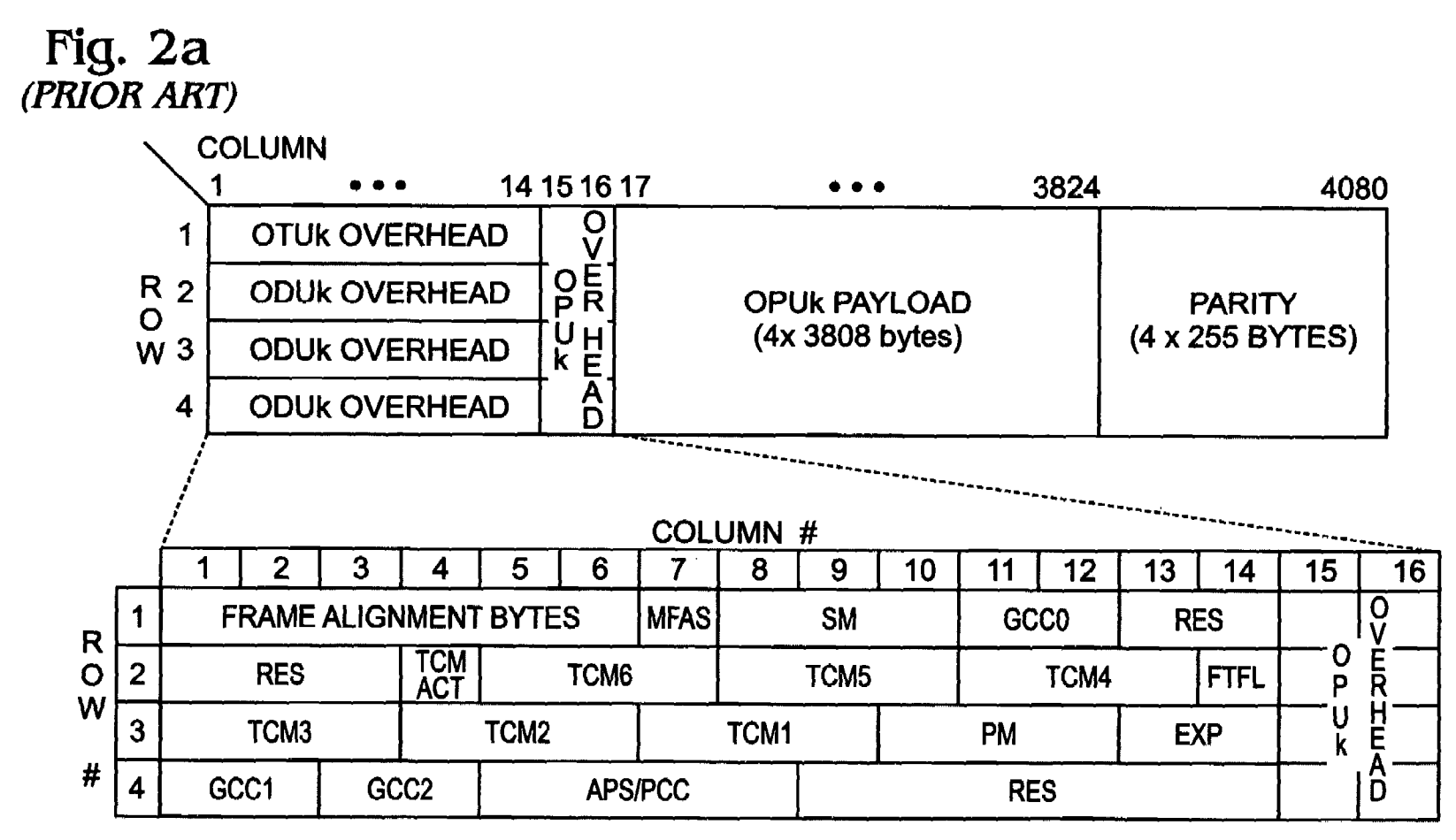

FIGS. 2A and 2B are diagrams illustrating the G.709 optical data unit (ODU) frame structure, and the ODU, optical channel payload unit (OPU), optical channel transport unit (OTU) overhead, and parity section (prior art). More specifically, a superframe is shown that is composed of 4 rows (frames). In a G.709 compliant system, it is normal to provide read access to all 64 of the G.709 overhead bytes by dropping them to the user interface during each frame. Alternately stated, 16 overhead bytes are dropped from each row and 64 overhead bytes are dropped from each frame.

In G.709, the received BIP byte is calculated after errors have been corrected with the FEC. In order for the BIP in any individual frame to reflect any errors at all, the error density in one or more sub-rows of the frame must be higher than 8 bytes out of 255. This is because the standard FEC algorithm used in G.709 networks is the Reed-Solomon (255,239) algorithm which has the ability to correct all errors in a 255 byte codeword, if there are no more than 8 bytes out of each 255 bytes received in error. Thus, the Reed-Solomon (255,239) algorithm used in G.709 systems will correct up to 8 byte errors in each 255-byte block. If more than 8 bytes in each 255-byte block are in error, the Reed-Solomon (255,239) algorithm is no longer able to correct the errors.

It would be advantageous if a greater number of errored bytes could be corrected in a communicated DW G.709 superframe.

It would be advantageous if a DW G.709 were able to recover more data in the presence of long bursts of noise.

SUMMARY OF THE INVENTION

The present invention describes a process for improving the parity coding possible for a standard G.709 superframe. The process does not add any additional parity bits to the frame. Neither is the payload of the frame reduced.

Accordingly, method is provided for coding a frame in a packet communications system using a G.709 Digital Wrapper Frame format. The method comprises: accepting digital information; outer encoding the digital information with a Reed Solomon (RS) encoding scheme; interleaving the outer encoded information; inner encoding the interleaved information using a BCH encoding scheme; and, forming a G.709 Digital Wrapper frame including payload and parity bytes. More specifically, a standard DW superframe is formed with 122,368 bits of payload and 8192 bits of parity.

The outer encoding process uses an RS(1023,1007) parent code. In one aspect, 15 groups of RS(781,765) and 1 group of RS(778,762) codewords are formed per superframe. The inner encoding process uses a BCH(2047,1959) parent code. In one aspect, 64 groups of BCH(2040,1952) codewords are formed per superframe.

In some aspects, the method further comprises: accepting a G.709 Digital Wrapper frame including payload and parity bytes; inner decoding the frame using a BCH decoding scheme; deinterleaving the inner decoded information; outer decoding the deinterleaved information with an RS decoding scheme; and, supplying (recovering) the digital information.

Additional details of the above-described method and a system for coding a frame in a packet communications network using a G.709 Digital Wrapper Frame format are provided below.

BRIEF DESCRIPTION OF THE DRAWINGS

FIGS. 1a and 1b are diagrams illustrating the interleaving process and the formation of an interleaved frame (prior art).

FIGS. 2A and 2B are diagrams illustrating the G.709 optical data unit (ODU) frame structure, and the ODU, optical channel payload unit (OPU), optical channel transport unit (OTU) overhead, and parity section (prior art).

DETAILED DESCRIPTION OF THE PREFERRED EMBODIMENTS

Figure 2B:
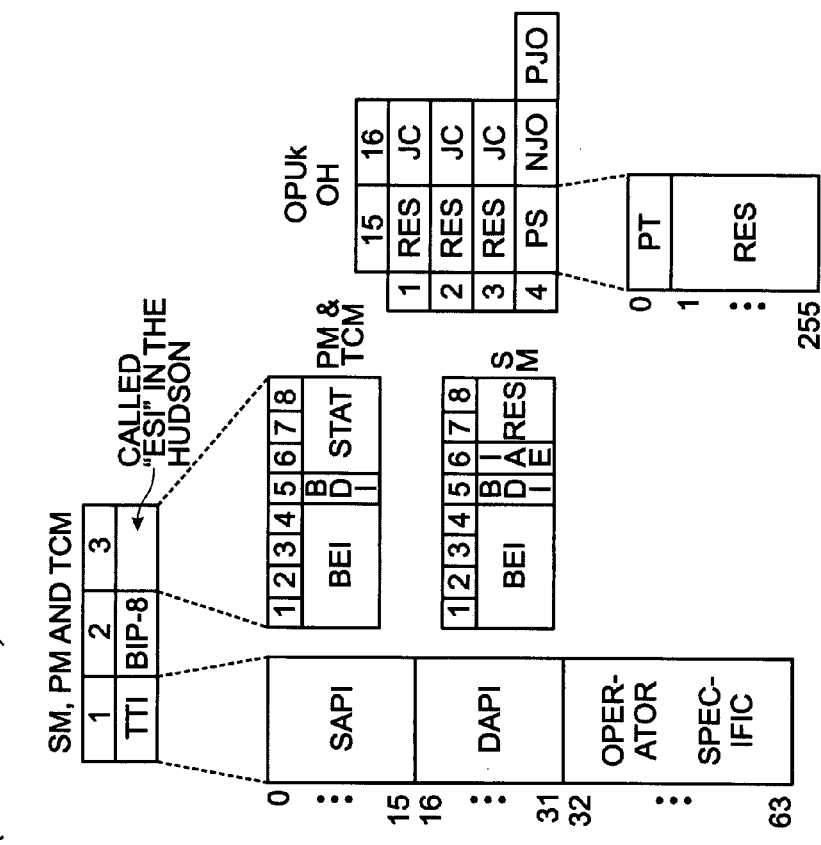
Figure 3:
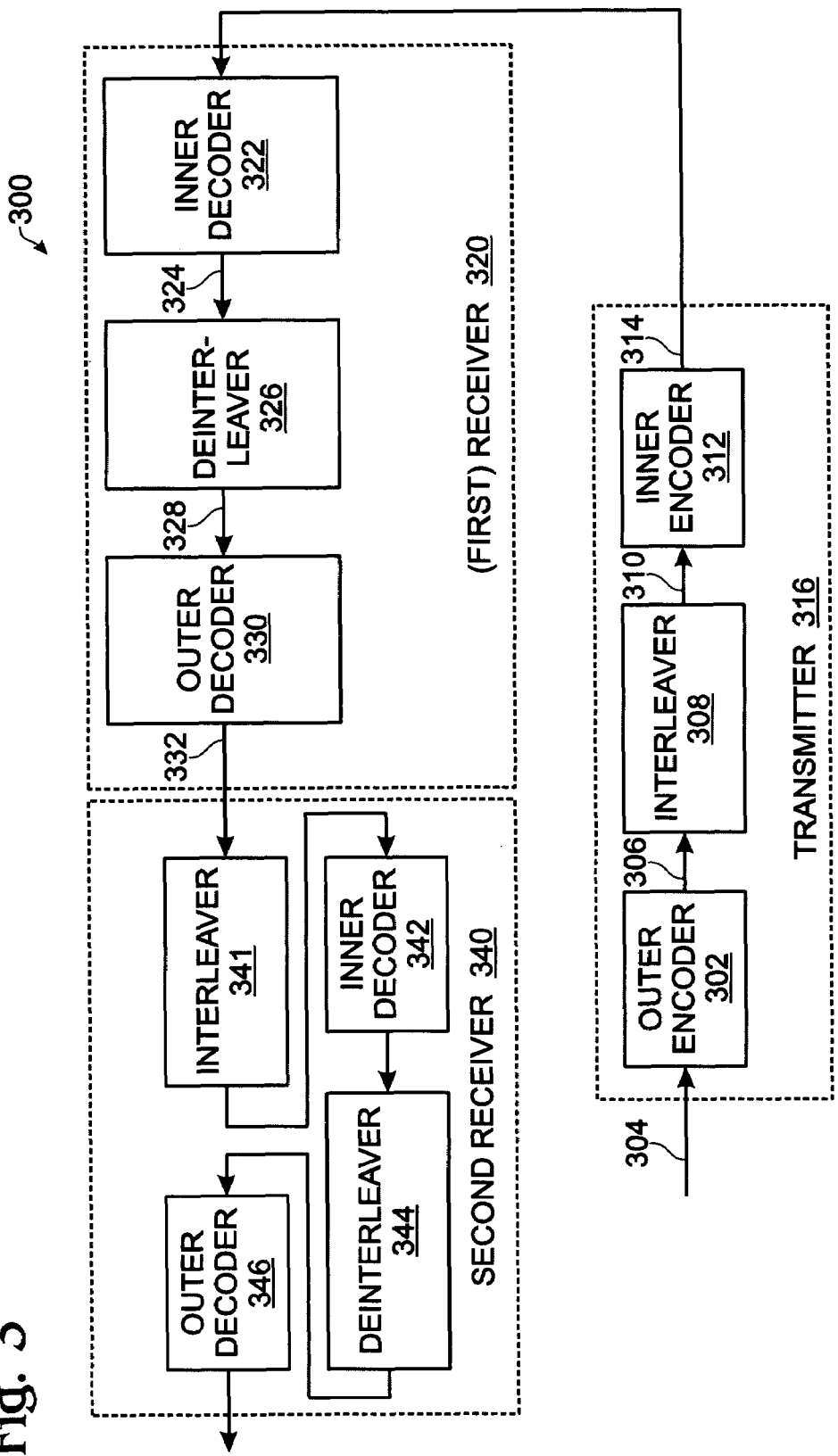
FIG. 3 is a schematic block diagram illustrating the present invention system for coding a frame in a packet communications network using a G.709 Digital Wrapper Frame format.

FIG. 3 is a schematic block diagram illustrating the present invention system for coding a frame in a packet communications network using a G.709 Digital Wrapper Frame format. The system 300 comprises an outer encoder 302 having an input on line 304 to accept digital information, such as SONET packets. The outer encoder 302 has an output on line 306 to supply the digital information encoded with a Reed Solomon (RS) encoding scheme. An interleaver 308 has an input connected to the outer encoder output on line 306. The interleaver 308 has an output on line 310 to supply the RS encoded information in an interleaved form.

An inner encoder 312 has an input on line 310 to accept the interleaved information. The inner encoder 312 encodes the interleaved information with a BCH encoding scheme and supplies a G.709 Digital Wrapper frame including payload and parity bytes at an output on line 314. The inner encoder 312 supplies a G.709 Digital Wrapper superframe with 122,368 bits of payload and 8192 bits of parity.

Figure 4:
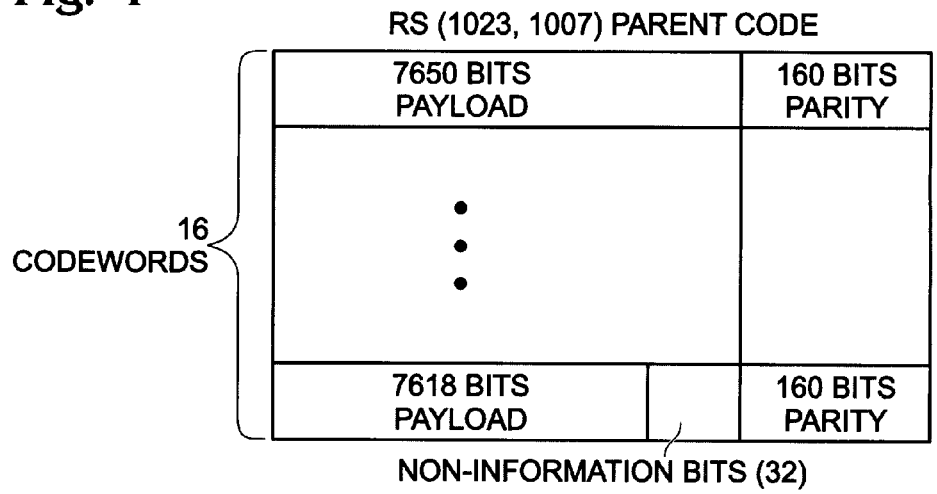
FIG. 4 is a diagram illustrating the codewords formed as a result of the outer encoding process.

FIG. 4 is a diagram illustrating the codewords formed as a result of the outer encoding process. The outer encoder 302 encoding scheme uses a RS(1023,1007) parent code. As a result, 16 groups of shortened codewords per superframe. Note that 32 "dummy" bits are generated as a result of the process. These non-information bits can be inserted into any of the codewords, or distributed over all 16 codewords. In one aspect as shown, the 32 non-information bits are inserted into the 16$^{th}$ codeword. Alternately stated, the outer encoder 302 encodes 15 groups of RS(781,765) and 1 group of RS(778,762) per superframe. However, the invention is not limited to any particular group organization. The outer encoder 302 forms 10-bit symbol codewords, as explained in more detail below.

Returning to FIG. 3, the inner encoder 312 encoding scheme uses a BCH(2047,1959) parent code. As a result, 64 groups of shortened codewords per superframe. In one aspect, 64 groups of BCH(2040,1952) codewords per superframe. However, the invention is not limited to any particular group organization. For example, all the even numbered codewords could be made a few bits longer, and all the odd numbered codewords could be made a few bits shorter, with a different number of information bits in the odd and even codewords.

The above-mentioned outer encoder 302, interleaver 308, and inner encoder 312 function as a transmitter 316. Some aspects of the system 300 further comprise a receiver 320 including an inner decoder 322 having an input on line 314 to accept a G.709 Digital Wrapper frame including payload and parity bytes. The inner decoder 322 and supplies a BCH decoded frame at an output on line 324. A deinterleaver 326 has an input connected to the inner decoder output on line 324 and an output on line 328 to supply the BCH decoded information in a deinterleaved form. An outer decoder 330 has an input connected to the deinterleaver output on line 328. The outer decoder 330 has an output on line 332 to supply the deinterleaved information decoded with a RS decoding scheme. For example, if the information accepted on line 304 was SONET packets, then SONET packets would be supplied (recovered) on line 332. The inner decoder 322 decoding scheme uses a BCH(2047,1959) parent code and the outer decoder 330 decoding scheme uses a RS(1023,1007) parent code.

Some aspects of the system further comprise a second receiver 340. The second receiver 340 includes an interleaver 341 having an input connected to the output of the first receiver outer decoder 330. Further, the second receiver 340 would include an inner decoder 342, a deinterleaver 344, and an outer decoder 346, as described above in the explanation of the first receiver 320. In fact, although it is not shown, a plurality of receiver can be iteratively connected. The increase in processing time is offset by improved error recovery.

Functional Description

The AMCC Niagara product line represents one embodiment of the above-mentioned coding system, which is referred to an Enhanced FEC (EFEC) coding. The EFEC coding consists of 2 interleaved codes:

RS(1023,1007) parent outer code, m=10 T=8; and,
BCH (2047,1952) parent inner code, m=11 T=8;

where m relates to number of elements in the field GF($2^m$), and T is the error correction capability.

These 2 interleaved codes are targetted at providing additional coding gain on the standard G.709 ODU payload while maintaining the exact data rates at the G.709 OTU, i.e. 7% overhead.

The ODU payload consists of 16×239×4×8 bits=122368 bits in total. These 122368 bits are divided into 16 groups and are then encoded with 15 RS(781,765) and 1 RS(778, 762) code, both of which are shortened codes of the parent code listed above. Note that the parent code above operates on an m=10 Galois Field, so data is grouped into dectets and are operated on accordingly. If the ODU payload bits are numbered as odu[0], odu[1] up to odu[122367], then the interleaving can be clearly explained. Keeping in mind that odu[0] is the first transmitted bit, followed by odu[1] and so on up to odu[122367]. i.e in G.709 terms, {odu[0], odu[1], odu[2], odu[3], odu[4], odu[5], odu[6], odu[7]}=0xf6, the first OA1 byte in the G.709 frame.

Using this convention, the odu bits are packed into the payload portion of the RS codes. This first RS code RS[0] is an RS(781,765) over m=10. 765×10 bits must be packed into the first 765 dectets of this code. Thus, bits odu[0] . . . odu[9] form the first dectet of the first RS code. Bits odu[10] . . . odu[19] form the second dectet of RS[0]. The bits are repeatedly packed into 765 dectets of RS[0] for a total of 7650 bits, i.e. odu[0] . . . odu[7649]. At this point the data is then RS encoded over m=10 T=8, and 2T parity symbols are added to the code. Thus, the next 16*10 bits consist of RS parity.

Now, the OTU output data is considered. This output data consists of 16×255×4×8 bits or 130560 bits. These bits can be numbered otu[0] . . . otu[130559]. The first RS code is now mapped to the output otu. i.e odu[0] . . . odu[7649]→otu[0] . . . otu[7649]. The next 160 bits of rs parity are now mapped to the otu. i.e rsparity[0] . . . rsparity[159]→otu[7650] . . . otu[7809].

Having completed the first RS code, the next 7650 bits of odu are mapped to the otu. i.e odu[7650] . . . odu[15299]→otu[7810] . . . otu[15459]. These 765 dectets are rs encoded, and the 160 bits of rs parity are inserted into the outgoing otu. i.e. rsparity[0] . . . rsparity[159]→otu[15460] . . . otu[15619].

This process is repeated for all 15 RS codes in the same manner. For the 16th and final code, there are 122368–15*765*10=7618 bits of remaining odu. These bits are packed into 762 dectets. The final 32 bits, which are missing are 0 filled and packed into the last dectet. These 762 dectets are RS encoded with an RS(778,762) code. Again, 160 bits of parity are added to the outgoing otu. Thus, odu[114749] . . . odu[122367]→otu[1171491] . . . otu[124767]. Note that the last 32 bits are 0 filled for the purpose of RS encoding, however, they are not actually transmitted into the outgoing otu. The 160 parity bits are added as follows:

rsparity[0] . . . rsparity[159]→otu[124768] . . . otu[124927].

Having completed the RS outer code, the BCH inner code is now added to the otu. The 124928 otu bits are then mapped into 64 identical BCH codes of BCH(2040,1952) with m=11 and T=8, the parent code is shown above. This requires the 124928 bits to be grouped into 64 partitions of 1952 bits. The BCH mapping is as follows: otu[0] is used as the first bit for BCH[0]. otu[1] is used as the first bit for BCH[1] repeatedly until otu[63] is used as the first bit for BCH[63]. Then, otu[64] is used as the second bit for BCH[0]. otu[65] is used as the second bit for BCH[1]. This process is repeated until all 124928 otu bits are consumed by the 64 BCH codes.

For each of the 64 BCH codes, the 1952 payload bits are encoded and 88 parity bits are added to the output. The 88 bits result from the product of T=8 and m=11 for the BCH codes. The BCH parity is added to the output otu as follows:

BCH[0] bchparity[0]→otu[124928], BCH[1] bchparity[0]→otu[124929] repeatedly until BCH[63] bchparity[0]→otu[124992]. Then, the next bit of each BCH code is added to the output otu. i.e. BCH[0] bchparity[1]→otu[124993]. This process is repeated until all 64 BCH codes have exhausted their 88 parity bits. i.e., BCH[63] bchparity[87]→otu[130559], the last bit the output otu frame.

Figure 5:
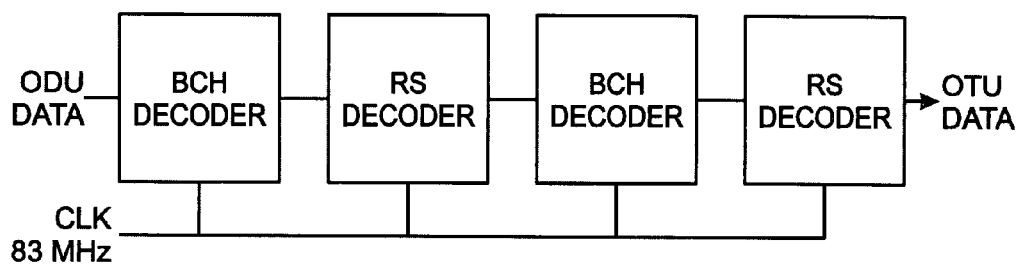
FIG. 5 is a diagram illustrating the Niagara EFEC decoding iteration scheme.

FIG. 5 is a diagram illustrating the Niagara EFEC decoding iteration scheme. Two stages of bch/rs decoding are done which results in the high code gain for the device. Note that at each of the BCH and RS stages, the failure detection mechanism operates on a per individual code basis and disables the correction logic to prevent the multiplication of errors that would otherwise be created.

RS Decoder Failure Mechanism

When more than T errors exist in the received RS codeword, the correction capability of the decoder is overloaded and a failure condition exists. The following error conditions are possible:

Uncorrectable Code

An uncorrectable code condition exists when the degree of the error locator polynomial is not equal to the number of roots found in the error locator polynomial. Functionally, this is done in the chien module where the roots of the error locator polynomial are identified. If the total number of roots found is not equal to the final value of L found by the berlekamp massey algorithm, an error condition is flagged and all 8 error magnitudes are set to 0. When this occurs, none of the RS codewords are modified due to the zeroing of the error magnitudes.

Aliased Codeword

When the number of errors in the received codeword exceeds the error correction capability of the decoder, it is possible that the errors map the original codeword into another codeword. This aliased codeword may or may not be valid. If the aliased codeword is valid, the computed syndromes are all zero are there is no way of detecting that the codeword has been aliased. In this case, the error magnitudes will all compute to zero, and no modification of the received codeword is performed. An invalid codeword is one where the computed syndromes are non-zero. The decoder may or may not determine the degree of the error locator polynomial is equal to the number of roots found. If this condition occurs, then the aliased codeword is uncorrectable, the error magnitude values are set to zero and the codeword is not affected. If, however, the aliased codeword is determined to be not uncorrectable, the error magnitudes are calculated and additional noise is injected into the received codeword. In any of these cases, the decoder is not capable of detecting an aliased codeword.

Shortened Codeword

Another possible indicator that a codeword is uncorrectable, or possibly aliased is when the rs code is a shortened version of the full parent code. This is the case with Niagara. Given that the parent code is an RS(1023,1007), and the implemented code is an RS(781,765), the only valid addresses for the detected error location are from 0 to 780. If an error is located outside of this valid range, the codeword is determined to be uncorrectable, and the correction logic is zeroed. This is effectively implemented in the chien by not searching all 1023 locations for possible roots. Only the valid locations are checked. If the error locator polynomial has roots outside of the valid range, the L value from the berlekamp massey algorithm will include these roots. When the chien totals the root count in the valid range, the final value will be short by the number of roots outside of the 0 to 780 window. This discrepancy between the number of roots found in the error locator polynomial, and the degree of the polynomial as reported by the berlekamp massey algorithm is used to flag an uncorrectable code. This mechanism has the advantage of saving gates in the chien by only searching for roots over the valid range, without sacrificing the additional failure detection provided by the shortened code.

BCH Decoder Failure Detect

The failure mechanism in the BCH decoder is identical to the failure mechanism in the RS decoder. The L value reported by the berlekamp massey algorithm is compared to the number of roots found in the chien. If the values are different, the block is considered uncorrectable, and the correction logic is disabled.

Figure 6:
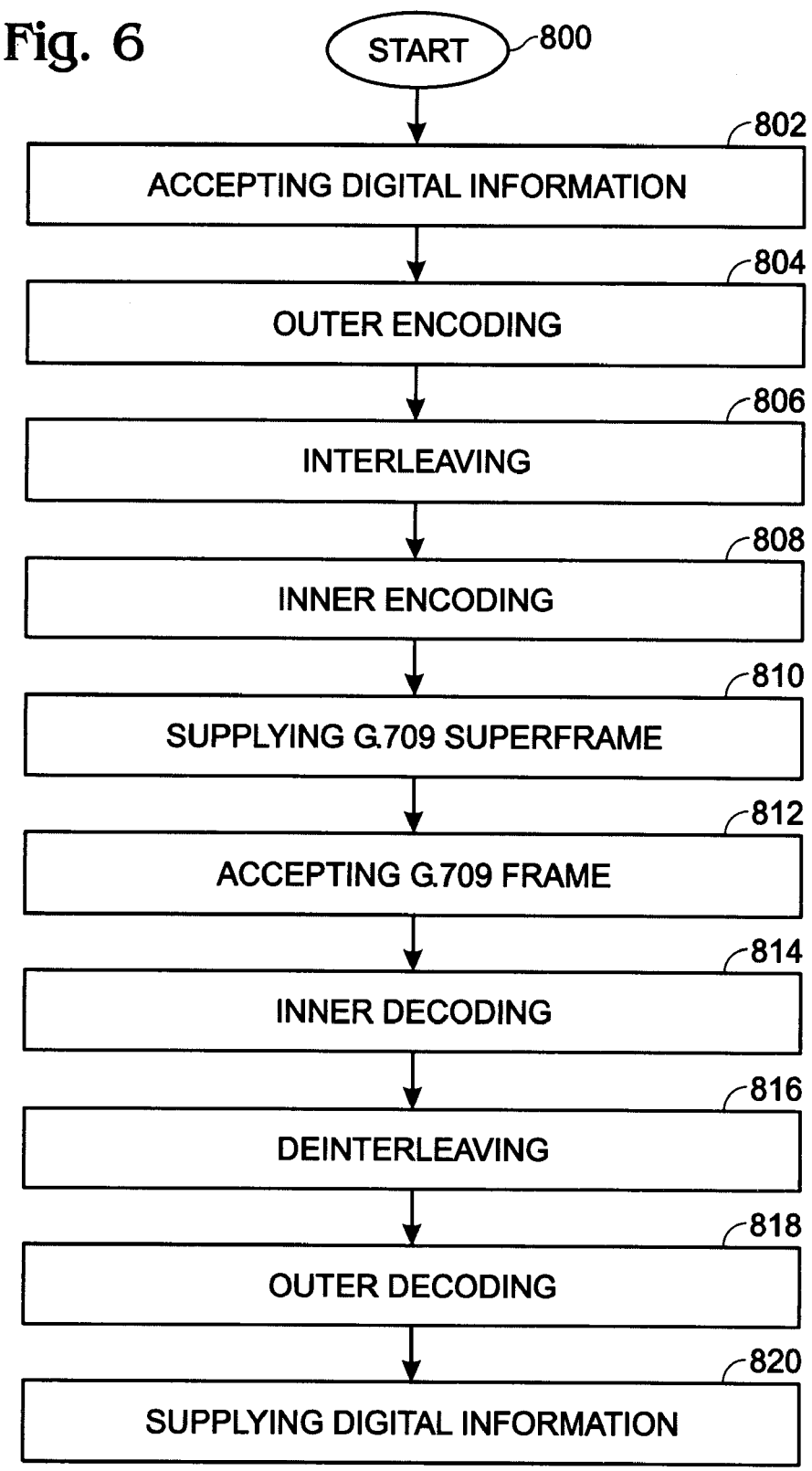
FIG. 6 is a flowchart illustrating the present invention method for coding a frame in a packet communications system using a G.709 Digital Wrapper Frame format.

FIG. 6 is a flowchart illustrating the present invention method for coding a frame in a packet communications system using a G.709 Digital Wrapper Frame format. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800.

Step 802 accepts digital information. Step 804 outer encodes the digital information with a Reed Solomon (RS) encoding scheme. Step 806 interleaves the outer encoded information. Step 808 inner encodes the interleaved information using a BCH encoding scheme. Step 810 forms a G.709 Digital Wrapper frame including payload and parity bytes. More particularly, Step 810 forms a superframe with 122,368 bits of payload and 8192 bits of parity. Note, the method could also be described in the context of supplying four frames.

In some aspects of the method, outer encoding the digital information with a Reed-Solomon (RS) encoding scheme in Step 804 includes encoding with an RS(1023,1007) parent code. In one aspect, Step 804 encodes into 16 groups of shortened codewords per superframe. In one particular aspect Step 804 encodes into 15 groups of RS(781,765) and 1 group of RS(778,762) codewords per superframe. In another aspect, encoding with an RS(1023,1007) parent code in Step 804 includes forming 10-bit symbol codewords.

In some aspects, inner encoding the interleaved information using a BCH encoding scheme in Step 808 includes encoding with a BCH(2047,1959) parent code. For example, Step 808 encodes into 64 groups of shortened codewords (per superframe). In one particular aspect, Step 808 encodes 64 groups of BCH(2040,1952) codewords per superframe.

Some aspects of the method include further steps. Step 812 accepts a G.709 Digital Wrapper frame including payload and parity bytes. Step 814 inner decodes the frame using a BCH decoding scheme. Step 816 deinterleaves the inner decoded information. Step 818 outer decodes the deinterleaved information with an RS decoding scheme. Step 820 supplies digital information.

In some aspects, inner decoding the frame using a BCH decoding scheme in Step 814 includes decoding with a BCH(2047,1959) parent code. Then, outer decoding the digital deinterleaved information with an RS decoding scheme in Step 818 includes decoding with a RS(1023, 1007) parent code.

Figure 7:
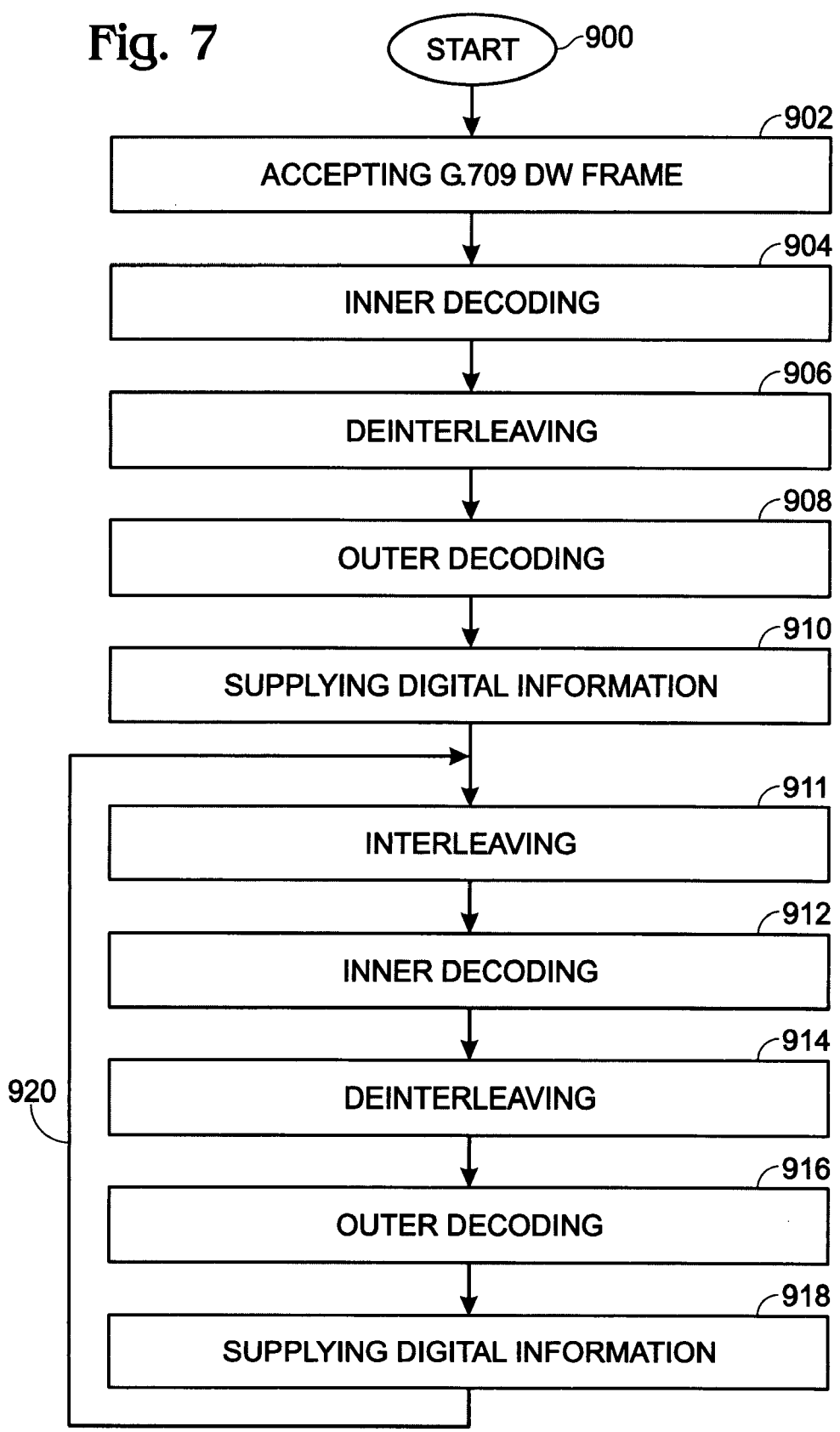
FIG. 7 is a flowchart illustrating another aspect of the present invention method for decoding a G.709 frame.

FIG. 7 is a flowchart illustrating another aspect of the present invention method for decoding a G.709 frame. The method starts at Step 900. Step 902 accepts a G.709 Digital Wrapper frame including payload and parity bytes. Step 904 inner decodes the frame using a BCH decoding scheme. Step 906 deinterleaves the inner decoded information. Step 908 outer decodes the digital deinterleaved information with an Reed-Solomon (RS) decoding scheme. Step 910 supplies digital information.

In some aspects, inner decoding the frame using a BCH decoding scheme in Step 904 includes decoding with a BCH(2047,1959) parent code. Then, outer decoding the digital deinterleaved information with an RS decoding scheme in Step 908 includes decoding with a RS(1023, 1007) parent code.

Some aspects of the method include further steps. Step 911, following a first stage of inner and outer decoding, interleaves the result. Step 912 inner decodes the interleaved information using a BCH decoding scheme. Step 914 deinterleaves the inner decoded information. Step 916 outer decodes the digital deinterleaved information with an Reed-Solomon (RS) decoding scheme. Step 918 supplies digital information. As represented by the arrow labeled with reference designator 920, the method may iteratively perform the inner and outer decoding process.

A system and method have been providing for using inner and outer coding in the process of transmitting and receiving DW G.709 superframes. Examples have been given to illustrate the invention, but the invention is not necessarily limited to these examples. Further, although the inner coding process has been described as BCH and the outer coding RS, the invention could also be enabled using BCH outer coding and RS inner coding. Other variations and embodiments of the invention will occur to those skilled in the art.

We claim:

1. In a packet communications system using a ITU-T G.709 Digital Wrapper (DW) Frame format, a method for coding a frame, the method comprising:
   accepting an ITU-T G.709 DW frame with a predetermined number of payload bytes;
   outer encoding the digital information with a Reed Solomon (RS) encoding scheme;
   interleaving the outer encoded information;
   inner encoding the interleaved information using a Bose, Ray-Chaudhuri, Hocquenghem (BCH) encoding scheme;
   forming an enhanced forward error correction (EFEC) framing having the same number of payload bytes as an ITU-T G.709 Digital Wrapper frame; and,
   communicating the EFEC frame.

2. The method of claim 1 wherein forming an EFEC frame includes forming a superframe with 122,368 bits of payload and 8192 bits of parity.

3. The method of claim 2 wherein outer encoding the digital information with a Reed-Solomon (RS) encoding scheme includes encoding with an RS(1023,1007) parent code.

4. The method of claim 3 wherein encoding with an RS(1023,1007) parent code includes encoding into 15 groups of RS(781,765) and 1 group of RS(778,762) codewords per superframe.

5. The method of claim 3 wherein encoding with an RS(1023,1007) parent code includes encoding into 16 groups of shortened codewords per super frame.

6. The method of claim 3 wherein encoding with an RS(1023,1007) parent code includes forming 10-bit symbol codewords.

7. The method of claim 2 wherein inner encoding the interleaved information using a BCH encoding scheme includes encoding with a BCH(2047,1959) parent code.

8. The method of claim 7 wherein inner encoding the interleaved information with a BCH(2047,1959) parent code includes encoding 64 groups of BCH(2040,1952) codewords per superframe.

9. The method of claim 7 wherein encoding with a BCH(2047,1959) parent code includes encoding into 64 groups of shortened codewords per superframe.

10. The method of claim 1 further comprising:
    accepting the EFEC frame including payload bytes;
    inner decoding the EFEC frame using a BCH decoding scheme;
    deinterleaving the inner decoded information;
    outer decoding the deinterleaved information with an RS decoding scheme; and,
    supplying an ITU-T G.709 DW frame with the same number of payload bytes as the EFEC frame.

11. The method of claim 10 wherein inner decoding the EFEC frame using a BCH decoding scheme includes decoding with a BCH(2047,1959) parent code; and,
    wherein outer decoding the digital deinterleaved information with an RS decoding scheme includes decoding with a RS(1023,1007) parent code.

12. In a packet communications system using an ITU-T G.709 Digital Wrapper (DW) Frame format, a method for decoding a frame, the method comprising:
    accepting an enhanced forward error correction (EFEC) frame including payload bytes;
    inner decoding the EFEC frame using a Bose, Ray-Chaudhuri, Hocquenghem (BCH) decoding scheme;
    deinterleaving the inner decoded information;
    outer decoding the digital deinterleaved information with an Reed-Solomon (RS) decoding scheme; and,
    supplying an ITU-T G.709 DW frame with the same number of payload bytes as the EFEC frame.

13. The method of claim 12 wherein inner decoding the frame using a BCH decoding scheme includes decoding with a BCH(2047,1959) parent code; and,
    wherein outer decoding the digital deinterleaved information with an RS decoding scheme includes decoding with a RS(1023,1007) parent code.

14. The method of claim 12 further comprising:
    following a first stage of inner and outer decoding, interleaving the result;
    inner decoding the interleaved information using a BCH decoding scheme;
    deinterleaving the inner decoded information;
    outer decoding the digital deinterleaved information with an Reed-Solomon (RS) decoding scheme; and,
    supplying an ITU-T G.709 DW frame with the same number of payload bytes as the EFEC frame.

15. The method of claim 14 further comprising:
    iteratively performing the inner and outer decoding process.

16. In a packet communications network using an ITU-T G.709 Digital Wrapper (DW) Frame format, a system for coding a frame, the system comprising:

an outer encoder having an input to accept an ITU-T G.709 DW frame with a predetermined number of payload bytes and an output to supply the ITU-T G.709 DW frame encoded with a Reed Solomon (RS) encoding scheme;

an interleaver having an input connected to the outer encoder output, and an output to supply the RS encoded information in an interleaved form; and, an inner encoder having an input to accept the interleaved information, the inner encoder encoding the interleaved information with a Bose, Ray-Chaudhuri, Hocquenghem (BCH) encoding scheme and supplying an enhanced forward error correction (EFEC) frame the same number of payload bytes as the ITU-T G-709 DW frame at an output.

17. The system of claim 16 wherein the inner encoder supplies an EFEC superframe with 122,368 bits of payload and 8192 bits of parity.

18. The system of claim 17 wherein the outer encoder encoding scheme uses a RS(1023,1007) parent code.

19. The system of claim 18 wherein the outer encoder encodes 15 groups of RS(781,766) and 1 group of RS(778, 762) per superframe.

20. The system of claim 18 wherein the outer encoder encodes 16 groups of shortened codewords per superframe.

21. The system of claim 18 wherein the outer encoder forms 10-bit symbol codewords.

22. The system of claim 17 wherein the inner encoder encoding scheme uses a BCH(2047,1959) parent code.

23. The system of claim 22 wherein inner encoder encodes 64 groups of BCH(2040, 1952) codewords per superframe.

24. The system of claim 22 wherein inner encoder encodes 64 groups of shortened codewords per superframe.

25. The system of claim 16 further comprising:
a first receiver including:
an inner decoder having an input to accept the EFEC frame including payload bytes and supplying a BCH decoded frame at an output;
a deinterleaver having an input connected to the inner decoder output and an output to supply the BCH decoded information in a deinterleaved form; and,
an outer decoder having an input connected to the deinterleaver output, and an output to supply the deinterleavered information decoded with a RS decoding scheme.

26. The system of claim 25 wherein the inner decoder decoding scheme uses a BCH(2047,1959) parent code; and,
wherein the outer decoder decoding scheme uses a RS(1023,1007) parent code.

27. The system of claim 25 further comprising:
a second receiver including:
an interleaver having an input connected to the output of the first receiver outer decoder, and an output;
an inner decoder having an input connected to interleaver output, and an output supplying a BCH decoded frame at an output;
a deinterleaver having an input connected to the inner decoder output and an output to supply the BCH decoded information in a deinterleaved form; and,
an outer decoder having an input connected to the deinterleaver output, and an output to supply the deinterleavered information decoded with a RS decoding scheme.

28. The system of claim 27 further comprising:
a plurality of iteratively connected receivers.

* * * * *